United States Patent
Konno et al.

(10) Patent No.: US 8,258,529 B2
(45) Date of Patent: Sep. 4, 2012

(54) LIGHT-EMITTING ELEMENT AND METHOD OF MAKING THE SAME

(75) Inventors: Taichiroo Konno, Hitachi (JP); Nobuaki Kitano, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 488 days.

(21) Appl. No.: 12/616,929

(22) Filed: Nov. 12, 2009

(65) Prior Publication Data
US 2010/0327298 A1 Dec. 30, 2010

(30) Foreign Application Priority Data
Jun. 26, 2009 (JP) ................................. 2009-152344

(51) Int. Cl.
*H01L 33/10* (2010.01)
*H01L 33/22* (2010.01)

(52) U.S. Cl. ............... 257/98; 257/95; 257/E33.069; 257/E33.067; 438/29; 438/47

(58) Field of Classification Search ............... 257/98, 257/94, 95, E33.067, E33.069, E33.074; 438/29, 47
See application file for complete search history.

(56) References Cited

U.S. PATENT DOCUMENTS

| 5,132,750 | A | * | 7/1992 | Kato et al. | 257/96 |
| 5,260,589 | A | | 11/1993 | Yamauchi et al. | |
| 8,049,233 | B2 | * | 11/2011 | Fukshima et al. | 257/98 |
| 2010/0084670 | A1 | * | 4/2010 | Cheng et al. | 257/98 |
| 2010/0264440 | A1 | * | 10/2010 | Park | 257/98 |

FOREIGN PATENT DOCUMENTS
JP 5-37017 2/1993
* cited by examiner

*Primary Examiner* — Matthew W Such
*Assistant Examiner* — Scott Stowe
(74) *Attorney, Agent, or Firm* — Scully, Scott, Murphy & Presser, P.C.

(57) ABSTRACT

A light-emitting element includes a semiconductor substrate, a light emitting portion including an active layer sandwiched between a first cladding layer of a first conductivity type and a second cladding layer of a second conductivity type different from the first conductivity type, a reflective portion provided between the semiconductor substrate and the light emitting portion for reflecting light emitted from the active layer, and a current spreading layer provided on the light emitting portion opposite to the reflective portion and including a concavo-convex portion on a surface thereof. The reflective portion includes a plurality of pair layers each including a first semiconductor layer and a second semiconductor layer different from the first semiconductor layer, and the first semiconductor layer has a thickness $T_{A1}$ defined by formulas (1) and (3), and the second semiconductor layer has a thickness $T_{B1}$ defined by formulas (2) and (4).

15 Claims, 8 Drawing Sheets

- 1 LIGHT-EMITTING ELEMENT
- 250 CONCAVO-CONVEX PORTION
- 30 FRONT SURFACE ELECTRODE
- 240 CURRENT SPREADING LAYER
- 230 INTERMEDIATE LAYER
- 224 SECOND CLADDING LAYER
- 20 LIGHT EMITTING PORTION
- 222 ACTIVE LAYER
- 220 FIRST CLADDING LAYER
- 210 REFLECTIVE PORTION
- 200 BUFFER LAYER
- 10 SEMICONDUCTOR SUBSTRATE
- 35 BACK SURFACE ELECTRODE

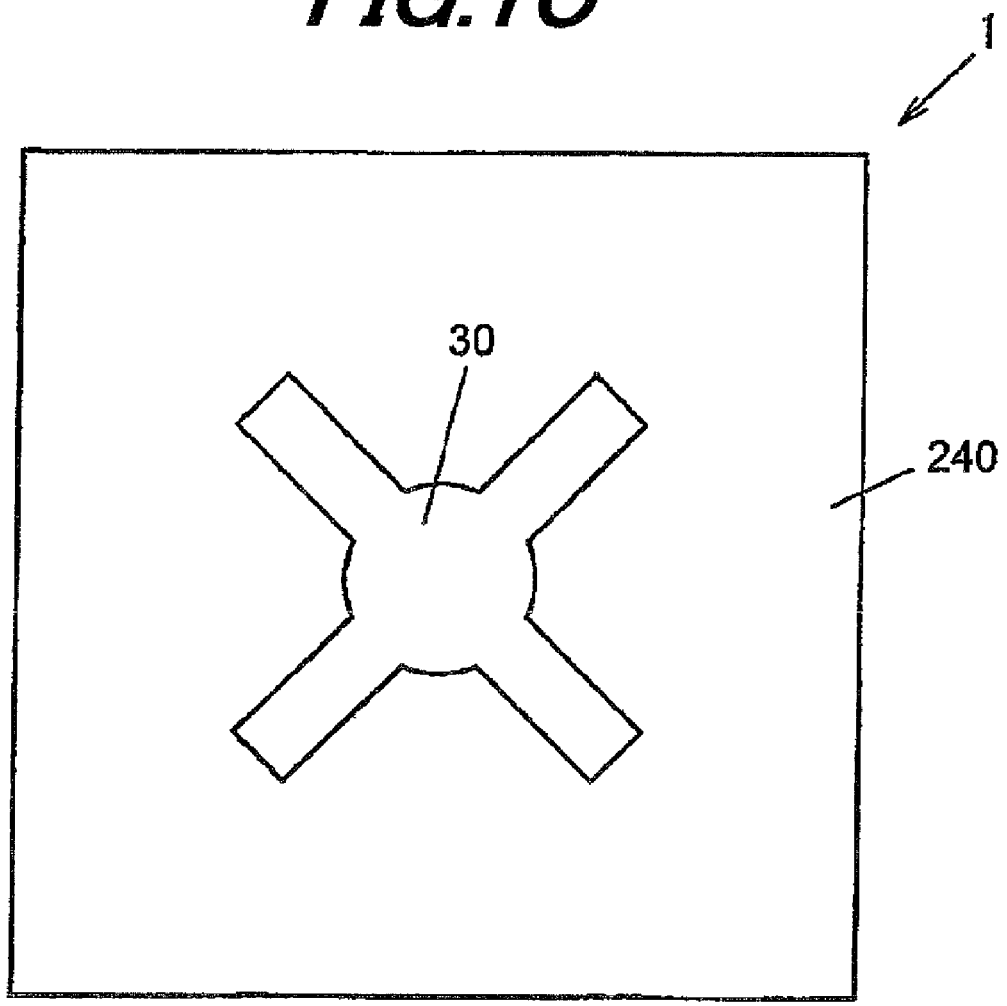

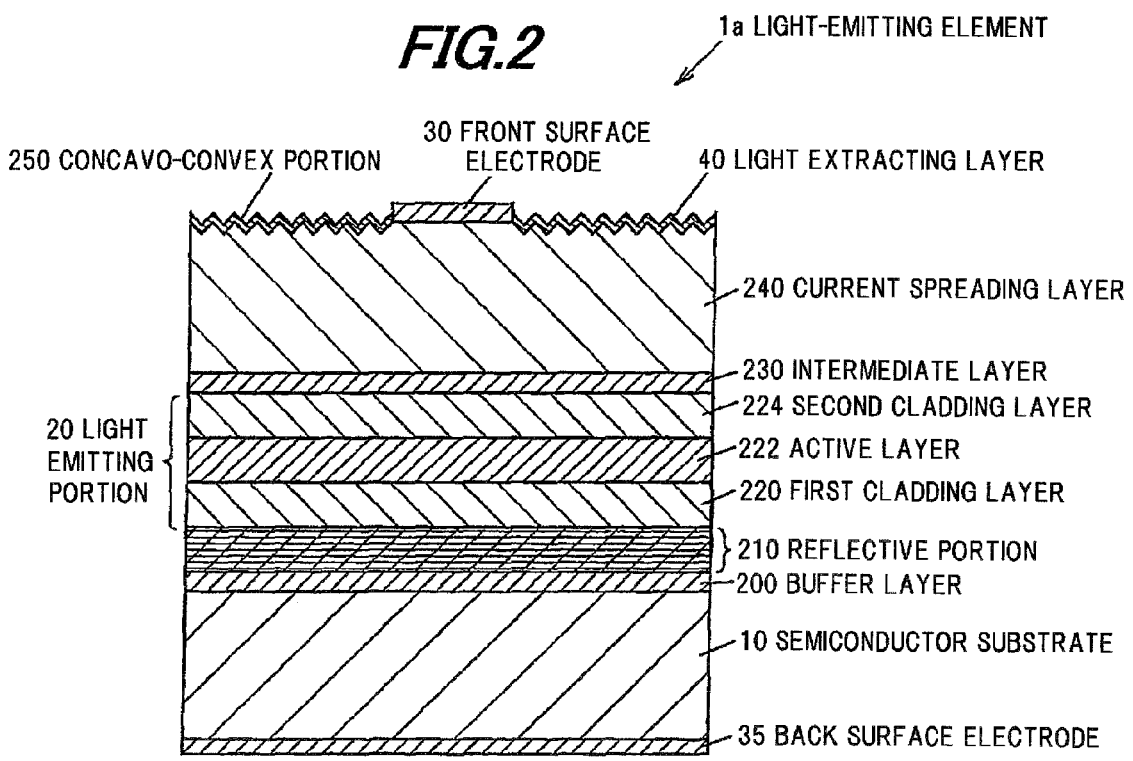

LIGHT-EMITTING ELEMENT AND METHOD OF MAKING THE SAME

The present application is based on Japanese Patent Application No. 2009-152344 filed on Jun. 26, 2009, the entire contents of which are incorporated herein by reference.

BACKGROUND OF THE INVENTION

1. Field of the Invention

The invention relates to a light-emitting element (which is herein used for the same meaning as an LED (light-emitting diode) chip) with a reflective layer and a method of making the same.

2. Related Art

A conventional light-emitting element is known which includes an n-type GaAs substrate, a light reflection layer provided on the n-type GaAs substrate, an n-type $Al_{0.45}Ga_{0.55}As$ cladding layer provided on the light reflection layer, a p-type GaAs active layer provided on the n-type $Al_{0.45}Ga_{0.55}As$ cladding layer, a p-type $Al_{0.45}Ga_{0.55}As$ cladding layer provided on the p-type GaAs active layer and a p-type GaAs cap layer provided on the p-type $Al_{0.45}Ga_{0.55}As$ cladding layer, and in which the light reflection layer has a laminated structure of n-type AlAs/n-type $Al_xGa_{1-x}As$, the laminated structure is formed in a chirp shape with continuously varied film thickness, and a relation among a variable thickness ratio, the number of laminations and a mix crystal ratio which allows to obtain a predetermined reflection wavelength band and a reflectance is defined. (e.g., see JP-A 5-37017).

Since a light reflection layer in the light-emitting element described in JP-A 5-37017 reflects light proceeded on a semiconductor substrate side by interference of light, it is possible to improve optical output.

However, in the light-emitting element described in JP-A 5-37017, although it is possible to expand a reflection wavelength region by a single light reflection layer, it is difficult to improve light output of the light-emitting element without increasing film thickness of the light reflection layer. In addition, the film thickness of the light reflection layer may be required to be increased in order to improve the light output of the light-emitting element, in such a case however, the production cost may significantly increase, which is an increase in raw materials or growth time, etc., due to an increase in total number of epitaxial layers to be grown.

SUMMARY OF THE INVENTION

It is an object of the invention to provide a high-output light-emitting element having an enhanced light extraction efficiency and a method of making the high-output light-emitting element without significantly increasing the production cost.

(1) According to one embodiment of the invention, a light-emitting element comprises:

a semiconductor substrate;

a light emitting portion comprising an active layer sandwiched between a first cladding layer of a first conductivity type and a second cladding layer of a second conductivity type different from the first conductivity type;

a reflective portion provided between the semiconductor substrate and the light emitting portion for reflecting light emitted from the active layer; and a current spreading layer provided on the light emitting portion opposite to the reflective portion and comprising a concavo-convex portion on a surface thereof, wherein the reflective portion comprises a plurality of pair layers each comprising a first semiconductor layer and a second semiconductor layer different from the first semiconductor layer, and the first semiconductor layer has a thickness $T_{A1}$ defined by formulas (1) and (3), and the second semiconductor layer has a thickness $T_{B1}$ defined by formulas (2) and (4), $$T_{A1} = \frac{\lambda_P}{4n_A\sqrt{1-\left(\frac{n_{In}\sin\theta}{n_A}\right)^2}} \qquad \text{Formula (1)}$$

$$T_{B1} = \frac{\lambda_P}{4n_B\sqrt{1-\left(\frac{n_{In}\sin\theta}{n_B}\right)^2}} \qquad \text{Formula (2)}$$

$$T_{A1} \geq \frac{\lambda_P}{4n_A} \qquad \text{Formula (3)}$$

$$T_{B1} \geq \frac{\lambda_P}{4n_B}, \qquad \text{Formula (4)}$$

where $\lambda_{P1}$ is a peak wavelength of the light emitted from the active layer, $n_A$ is a refractive index of the first semiconductor layer, $n_B$ is a refractive index of the second semiconductor layer, $n_{1n}$ is a refractive index of the first cladding layer, and $\theta$ is an incident angle (which is defined as an angle with respect to a normal line of an incident plane) from the first cladding layer to the first semiconductor layer.

In the above embodiment (1), the following modifications and changes can be made.

(i) The reflective portion comprises at least three pair layers, thicknesses of a plurality of the pair layers are different from each other due to a $\theta$ value in the formulas (1) and (2) being different in each of a plurality of the pair layers, and at least one of a plurality of the pair layers comprises the first and second semiconductor layers with a $\theta$ value of not less than 50°.

(ii) The light-emitting element further comprises:

an intermediate layer provided between the second cladding layer and the current spreading layer, wherein the intermediate layer comprises a semiconductor having a bandgap energy between bandgap energies of a semiconductor composing the second cladding layer and a semiconductor composing the current spreading layer.

(iii) A plurality of the pair layers comprise a pair layer comprising the first semiconductor layer having a thickness $T_{A1}$ not less than 1.5 times $\lambda_{P1}/4 n_A$, and the second semiconductor layer having a thickness $T_{B1}$ not less than 1.5 times $\lambda_{1P}/4 n_B$.

(iv) The reflective portion comprises a semiconductor material having a bandgap energy greater than that of a semiconductor composing the active layer, the semiconductor material being transparent to the light emitted from the active layer.

(v) The first semiconductor layer comprises $Al_XGa_{1-X}As$ ($0 \leq X \leq 1$) or $Al_{0.5}In_{0.5}P$, and the second semiconductor layer is formed of $Al_YGa_{1-Y}As$ ($0 \leq Y \leq 1$) and has a refractive index different from that of the first semiconductor layer.

(vi) In a first pair layer, or first and second pair layers of the reflective portion counting from a side of the semiconductor substrate, the first semiconductor layer comprises AlAs or $Al_{0.5}In_{0.5}P$, and the second semiconductor layer comprises a semiconductor having a bandgap smaller than that of a semiconductor composing the active layer, or GaAs not transparent to the light emitted from the active layer.

(vii) The concavo-convex portion has arithmetic mean roughness Ra of not less than 0.04 μm and not less than 0.25 μm.

(viii) The concavo-convex portion has a root mean square roughness RMS of not less than 0.05 μm and not more than 0.35 μm.

(ix) The reflective portion comprises at least six pairs or more of the pair layers.

(x) The semiconductor substrate comprises GaAs.

(xi) The intermediate layer comprises $Ga_zIn_{1-z}P$ ($0.6 \leq Z \leq 0.9$), and the current spreading layer comprises GaP.

(xii) The light-emitting element further comprises:

a front surface electrode provided at a predetermined position in a region of the current spreading layer except a region where the concavo-convex portion is provided; and a light extracting layer formed at a portion except the front surface electrode, and comprising a material transparent to the light emitted from the active layer and having a refractive index smaller than that of the semiconductor composing the current spreading layer and larger than that of the air.

(xiii) The light extracting layer has a thickness d in a range of ±30% of a value defined by $A+\lambda_P/(4 \times n)$, where $\lambda_P$ is a wavelength of the light emitted from the active layer, n is a refractive index of a material composing the light extracting layer, and A (which is an odd number) is a constant.

(2) According to another embodiment of the invention, a method of making a light-emitting element comprising:

forming on a semiconductor substrate a reflective portion comprising a plurality of pair layers each comprising a first semiconductor layer and a second semiconductor layer different from the first semiconductor layer, a light emitting portion comprising an active layer sandwiched between a first cladding layer of a first conductivity type and a second cladding layer of a second conductivity type different from the first conductivity type, and a current spreading layer formed on the light emitting portion;

forming a front surface electrode at a predetermined position of the current spreading layer; and forming a concavo-convex portion in a portion except a region where the front surface electrode is formed, wherein the first semiconductor layer has a thickness $T_{A1}$ defined by formulas (1) and (3), and the second semiconductor layer has a thickness $T_{B1}$ defined by formulas (2) and (4), $$T_{A1} = \frac{\lambda p}{4n_A \sqrt{1 - \left(\frac{n_{In}\sin\theta}{n_A}\right)^2}} \quad \text{Formula (1)}$$

$$T_{B1} = \frac{\lambda p}{4n_B \sqrt{1 - \left(\frac{n_{In}\sin\theta}{n_B}\right)^2}} \quad \text{Formula (2)}$$

$$T_{A1} \geq \frac{\lambda_p}{4n_A} \quad \text{Formula (3)}$$

$$T_{B1} \geq \frac{\lambda_p}{4n_B}, \quad \text{Formula (4)}$$

where $\lambda_{P1}$ is a peak wavelength of the light emitted from the active layer, $n_A$ is a refractive index of the first semiconductor layer, $n_B$ is a refractive index of the second semiconductor layer, $n_{In}$ is a refractive index of the first cladding layer, and θ is an incident angle (which is defined as an angle with respect to a normal line of an incident plane) from the first cladding layer to the first semiconductor layer.

In the above embodiment (1), the following modifications and changes can be made.

(xiv) The forming of the concavo-convex portion is carried out after the forming of the front surface electrode.

Points Of The Invention

According to one embodiment of the invention, a light-emitting element is provided with a reflective portion having plural pair layers composed of a first semiconductor layer and a second semiconductor layer whose thicknesses are controlled corresponding to plural incident angles. Even when emitted light is incident to the reflective portion from various incident angles, the reflective portion can reflect light to a light extracting surface side. Furthermore, since the light-emitting element is provided with a concavo-convex portion on the light extracting surface, it is possible to efficiently extract light reflected by the reflective portion outside the light-emitting element. Thus, the light-emitting element can demonstrate improved light extraction efficiency.

BRIEF DESCRIPTION OF THE DRAWINGS

Next, the present invention will be explained in more detail in conjunction with appended drawings, wherein:

FIG. 1C is a plan view showing a light-emitting element in the first embodiment of the invention;

FIG. 2 is a cross sectional view showing a light-emitting element in a second embodiment of the invention;

DESCRIPTION OF THE PREFERRED EMBODIMENTS

First Embodiment

Figure 1A:
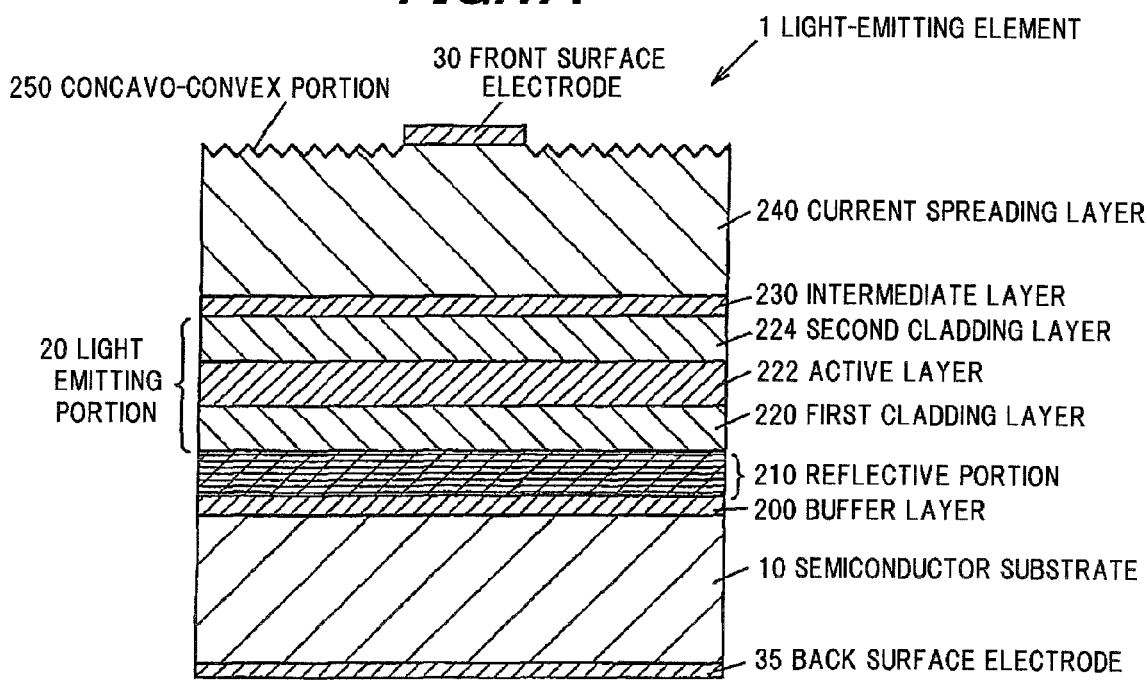
FIG. 1A is a cross sectional view showing a light-emitting element in a first preferred embodiment of the invention.
Figure 1B:
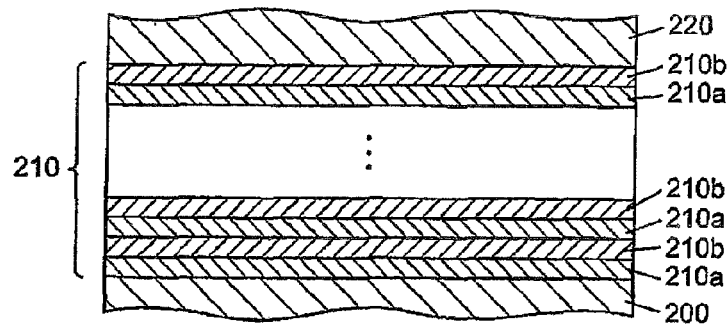
FIG. 1B is a cross sectional view showing a reflective portion of the light-emitting element in the first embodiment of the invention.

FIG. 1A shows a schematic cross section of a light-emitting element in a first embodiment of the invention, FIG. 1B shows a schematic cross section of a reflective portion provided in the light-emitting element in the first embodiment of the invention and FIG. 1C shows a schematic view of an upper surface of the light-emitting element in the first embodiment of the invention.

Overall Structure of Light-emitting Element 1

A light-emitting element 1 in the first embodiment is, as an example, a light emitting diode (LED) which radiates red light. In detail, the light-emitting element 1 includes a semiconductor substrate 10 of n-type as a first conductivity type, an n-type buffer layer 200 provided on the semiconductor substrate 10, a reflective portion 210 provided on the buffer layer 200 so as to have a multilayer structure of n-type compound semiconductors, an n-type first cladding layer 220 provided on the reflective portion 210, an active layer 222 provided on the first cladding layer 220, a second cladding layer 224 of p-type as a second conductivity type different from the first conductivity type provided on the active layer 222, a p-type intermediate layer 230 provided on the second cladding layer 224, and a current spreading layer 240 provided on the intermediate layer 230 and having a concavo-convex portion 250 on a surface thereof (i.e., a light extracting surface).

In addition, the light-emitting element 1 further includes a front surface electrode 30 provide at a predetermined position in a region of the current spreading layer 240 excluding a region where the concavo-convex portion 250 is provided, and a back surface electrode 35 provided on a surface of the semiconductor substrate 10 opposite to a surface where the buffer layer 200 is provided (i.e., a back surface of the semiconductor substrate 10). In the present embodiment, the active layer 222 is provided so as to be sandwiched between the first cladding layer 220 and the second cladding layer 224, and in the following explanation, the first cladding layer 220, the active layer 222 and the second cladding layer 224 may be collectively called a light emitting portion 20. Alternatively, the light-emitting element 1 may further include a pad electrode as a wire bonding pad on the front surface electrode 30.

Semiconductor Substrate 10 and Buffer Layer 200

As the semiconductor substrate 10, it is possible to use, e.g., a GaAs substrate containing a carrier of a predetermined conductivity type and having a predetermined carrier concentration. In addition, a miss oriented substrate with a predetermined off-angle or a just substrate without off-angle can be used for the semiconductor substrate 10. Alternatively, a compound semiconductor material composing the semiconductor substrate 10 can be appropriately changed according to types of plural compound semiconductor layers to be formed on the semiconductor substrate 10.

Reflective Portion 210

The reflective portion 210 is provided between the semiconductor substrate 10 and the light emitting portion 20, and reflects the light emitted from the active layer 222. In detail, as shown in FIG. 1B, the reflective portion 210 has a laminated structure of plural compound semiconductor layers. The reflective portion 210 is formed of a semiconductor material which has a bandgap greater than that of a semiconductor composing the active layer 222 and is transparent to the light emitted from the active layer 222.

In addition, the reflective portion 210 is formed having plural pair layers composed of a first semiconductor layer 210a and a second semiconductor layer 210b having a refractive index different from that of the first semiconductor layer 210a. The reflective portion 210 is formed having at least 6 pairs of pair layers. The first semiconductor layer 210a can be formed of, e.g., $Al_XGa_{1-X}As$ ($0 \leq X \leq 1$) or $Al_{0.5}In_{0.5}P$, and the second semiconductor layer 210b can be formed of, e.g., $Al_YGa_{1-Y}As$ ($0 \leq Y \leq 1$). The first semiconductor layer 210a and the second semiconductor layer 210b are formed so as to have different refractive indexes each other. When the first semiconductor layer 210a is formed of AlGaAs, an Al composition "x" of the first semiconductor layer 210a is controlled to a value different from an Al composition "y" of the second semiconductor layer 210b. In addition, the first semiconductor layer 210a and the second semiconductor layer 210b can be formed having a thickness depending on an incident angle of the light as described below, however, in FIG. 1B, it is shown as the substantially same thickness for convenience of explanation.

Here, the plural pair layers of the reflective portion 210 each reflect light with a wavelength greater than an emission peak wavelength of the light emitted from the active layer 222, and each reflect the light from different incident angles. In detail, when a peak wavelength of the light emitted from the active layer 222 is defined as $\lambda_P$, a refractive index of the first semiconductor layer is defined as $n_A$, a refractive index of the second semiconductor layer is defined as $n_B$, a refractive index of the first cladding layer 220 is defined as $n_{In}$, and an incident angle from the first cladding layer to the first semiconductor layer is $\theta$ (defined as an angle with respect to a normal line of incident plane), the first semiconductor layer 210a is formed having a thickness $T_{A1}$ defined by following formulas (1) and (3). Meanwhile, the second semiconductor layer 210b is formed having a thickness $T_{B1}$ defined by following formulas (2) and (4).

$$T_{A1} = \frac{\lambda_P}{4n_A\sqrt{1-\left(\frac{n_{In}\sin\theta}{n_A}\right)^2}} \quad \text{Formula (1)}$$

$$T_{B1} = \frac{\lambda_P}{4n_B\sqrt{1-\left(\frac{n_{In}\sin\theta}{n_B}\right)^2}} \quad \text{Formula (2)}$$

$$T_{A1} \geq \frac{\lambda_P}{4n_A} \quad \text{Formula (3)}$$

$$T_{B1} \geq \frac{\lambda_P}{4n_B} \quad \text{Formula (4)}$$

The first semiconductor layer 210a and the second semiconductor layer 210b included in the plural pair layers are each formed having a thickness greater than the thicknesses defined by the formulas (3) and (4) so as to reflect the light with a wavelength greater than an emission peak wavelength of the light emitted from the active layer 222. In addition, the first semiconductor layer 210a included in one pair layer among the plural pair layers is formed having a thickness calculated by the formula (1) corresponding to the incident angle $\theta$ of the light incident to the one pair layer. In the same way, the second semiconductor layer 210b included in the one pair is formed having a thickness calculated by the formula (2) corresponding to the incident angle $\theta$ of the light incident to the one pair layer. In the same way, other pairs layer included in the plural pair layers are also formed including the first semiconductor layer 210a and the second semiconductor layer 210b which have a thickness corresponding to the incident angle $\theta$ of the light incident to the other pair layers. The pair layer preferably includes the first semiconductor layer 210a having the thickness $T_{A1}$ which is 1.5 times of $\lambda_P/(4 \times n_A)$ and the second semiconductor layer 210b having the thickness $T_{B1}$ which is 1.5 times of $\lambda_P/(4 \times n_B)$.

Here, in the present embodiment, the reflective portion 210 is formed including at least 3 pair layers. The thicknesses of the plural pair layers are different from each other due to the value of θ in the formulas (1) and (2) which is different for each pair layers. For example, the thicknesses of one pair layer and another pair layer are formed to be different from each other. When the value of θ for the first pair layer is defined as $\theta_a$ and that for the other pair layer is defined as $\theta_b$, the thicknesses of the first semiconductor layer 210a and the second semiconductor layer 210b included in the one pair layer are calculated by the formulas (1) and (2) using the value $\theta_a$, and the thicknesses of the first semiconductor layer 210a and the second semiconductor layer 210b included in the other pair layer are calculated by the formulas (1) and (2) using the value $\theta_b$ which is different from $\theta_a$. Furthermore, by forming at least one pair layer so as to include the first semiconductor layer 210a and the second semiconductor layer 210b having a thickness defined by the value of θ of 50° or more, the light excluding direct incident light incident from the light emitting portion 20 to the reflective portion 210 can be reflected to the extracting surface side at the reflective portion 210. By including such a reflective portion 210 in the light-emitting element 1 in the present embodiment, even if the light radiated from the active layer 222 is incident at various incident angles, the light is reflected to a direction of the light extracting surface at the reflective portion 210.

In addition, when the first semiconductor layer 210a of first, or, first and second pair layers of the reflective portion 210 from the semiconductor substrate 10 side is formed of AlAs or $Al_{0.5}In_{0.5}P$, the second semiconductor layer 210b is preferably formed of a semiconductor having a bandgap smaller than that of a semiconductor composing the active layer 222, or GaAs opaque to the light emitted from the active layer 222.

Light Emitting Portion 20

The light emitting portion 20 has a first cladding layer 220, an active layer 222 and a second cladding layer 224. Firstly, the buffer layer 200 is provided in contact with the semiconductor substrate 10. For example, when the semiconductor substrate 10 is formed of an n-type GaAs substrate, the buffer layer 200 is formed of n-type GaAs. In addition, the first cladding layer 220, the active layer 222 and the second cladding layer 224 are each formed of, e.g., a ternary or quaternary group III compound semiconductor material represented by $(Al_xGa_{1-x})_YIn_{1-Y}P$ ($0 \leq X \leq 1$, $0 \leq Y \leq 1$). Alternatively, the active layer 222 in the first embodiment can be formed of e.g., a non-dope $Ga_xIn_{1-x}P$ single layer ($0 \leq X \leq 1$).

Intermediate Layer 230

When a semiconductor material composing the second cladding layer 224 and that composing the current spreading layer 240 are different from each other, the intermediate layer 230 is formed of a semiconductor material which reduces a potential barrier at a hetero-interface between the second cladding layer 224 and the current spreading layer 240. In detail, the intermediate layer 230 is provided between the second cladding layer 224 and the current spreading layer 240. In more detail, the intermediate layer 230 is provided on the second cladding layer 224 opposite to the active layer 222, and is formed of a semiconductor material having a bandgap energy between bandgap energies of the semiconductor material composing the second cladding layer 224 and the semiconductor material composing the current spreading layer 240. The intermediate layer 230 is formed of, e.g., p-type $Ga_ZIn_{1-Z}P$ (Z is, e.g., $0.6 \leq Z \leq 0.9$). It is possible to reduce forward voltage of the light-emitting element 1 by providing the intermediate layer 230 in the light-emitting element 1.

Current Spreading Layer 240

The current spreading layer 240 is provided on the light emitting portion 20 opposite to the reflective portion 210, and disperses a current supplied to the light-emitting element 1 so that the current is substantially uniformly supplied to the active layer 222. In addition, the current spreading layer 240 is formed of a semiconductor material transparent to the light emitted from the active layer 222. The current spreading layer 240 can be formed of p-type GaP, p-type GaAsP or p-type AlGaAs.

Concavo-Convex Portion 250

The concavo-convex portion 250 is formed by roughening a surface of the current spreading layer 240 opposite to the light emitting portion 20. The concavo-convex portion 250 is formed having a random shape by etching the surface thereof using a predetermined etchant. Alternatively, the concavo-convex portion 250 can be formed having a predetermined pattern on the surface. Furthermore, in order to improve light extraction efficiency of the light-emitting element 1, the concavo-convex portion 250 preferably has arithmetic mean roughness Ra of not less than 0.04 μm nor more than 0.25 nm and root mean square roughness RMS of not less than 0.05 μm nor more than 0.35 μm.

Front Surface Electrode 30 and Back Surface Electrode 35

The front surface electrode 30 is formed of a material in ohmic contact with the current spreading layer 240. In detail, the front surface electrode 30 is formed containing at least one metal material for a p-type electrode selected from metal materials such as Be, Zn, Ni, Ti, Pt, Al and Au, etc. For example, the front surface electrode 30 can be formed having a laminated structure in which AuBe, Ni and Au are laminated in this order from current spreading layer 240 side. The front surface electrode 30 is provided on a surface of the current spreading layer 240 opposite to the intermediate layer 230, i.e., a portion of a light extracting surface of the light-emitting element 1. In addition, as shown in FIG. 1C, the front surface electrode 30 is formed having a circular portion in a substantially circular shape and four leg portions extending to four corners of the light-emitting element 1, when the light-emitting element 1 is viewed from the top.

The back surface electrode 35 is formed of a material in ohmic contact with the semiconductor substrate 10. In detail, the back surface electrode 35 is formed containing at least one metal material for an n-type electrode selected from metal materials such as Ge, Ni, Ti, Pt, Al and Au, etc. For example, the back surface electrode 35 can be formed having a laminated structure in which AuGe, Ni and Au are laminated in this order from semiconductor substrate 10 side. The back surface electrode 35 is formed on the substantially entire back surface of the semiconductor substrate 10.

Modification

Although the light-emitting element 1 in the first embodiment includes the buffer layer 200 on the semiconductor substrate 10, a light-emitting element in the modification of the first embodiment can be formed without including the buffer layer 200.

In addition, although the light-emitting element 1 in the first embodiment emits light including red light (i.e., light with an emission wavelength of 630 nm band), the light emitted from the light-emitting element 1 is not limited thereto. It is also possible to form light-emitting element 1 emitting the light within a predetermined wavelength range by controlling the structure of the active layer 222. The light emitted from the active layer 222 includes, e.g., light within a wavelength range such as orange light, yellow light or green light, etc. In addition, the light emitting portion 20 provided in the light-emitting element 1 also can be formed of an InAl- GaN-based compound semiconductor including the active layer 222 which emits light in an ultraviolet region, a violet region or a blue region.

Furthermore, as for compound semiconductor layers which are the semiconductor substrate 10, the buffer layer 200, the reflective portion 210, the first cladding layer 220, the second cladding layer 224, the intermediate layer 230 and the current spreading layer 240 included in the light-emitting element 1, a conductivity type of a compound semiconductor composing these compound semiconductor layers can be reversed from the present embodiment. For example, the conductivity type of the semiconductor substrate 10, the buffer layer 200, the reflective portion 210 and the first cladding layer 220 can be replaced with p-type and the conductivity type of the second cladding layer 224, the intermediate layer 230 and the current spreading layer 240 can be replaced with n-type.

In addition, the active layer 222 can be formed having a quantum well structure. The quantum well structure can be formed from any of a single quantum well structure, a multiple quantum well structure or a strained multiple quantum well structure. The light emitting portion 20 can be formed including a semiconductor layer other than the first cladding layer 220, the active layer 222 and the second cladding layer 224.

In addition, the front surface electrode 30 can be formed in a square, rhombic or polygonal shape.

Making Method of Light-emitting Element 1

The light-emitting element 1 in the first embodiment is made, e.g., as follows. Firstly, the semiconductor substrate 10 is prepared. Then, a semiconductor laminated structure composed of group III-V compound semiconductor including plural compound semiconductor layers (i.e., the buffer layer 200, the reflective portion 210, the first cladding layer 220, the active layer 222, the second cladding layer 224, the intermediate layer 230 and the current spreading layer 240) is formed on the semiconductor substrate 10 by, e.g., a Metal Organic Vapor Phase Epitaxy method (MOVPE method) (a growth process). As a result, an epitaxial wafer is made.

Here, formation of the semiconductor laminated structure using the MOVPE method is carried out by setting a growth temperature to 650° C., growth pressure to 6666.1 Pa (50 Torr), each growth rate of plural compound semiconductor layers of the semiconductor laminated structure to 0.3-1.5 nm/sec, and a V/III ratio to around 150. The V/III ratio is a mole ratio of a V group material such as arsine ($AsH_3$) or phosphine ($PH_3$), etc., with reference to a mole ratio of a III group material such as trimethylgallium (TMGa) or trimethylaluminum (TMAl), etc.

In addition, as a raw material used in the MOVPE method, it is possible to use an organic metallic compound such as trimethylgallium (TMGa) or triethylgallium (TEGa) as a Ga raw material, trimethylaluminum (TMAl) as an Al raw material, and trimethylindium (TMIn) for an In raw material, etc. In addition, it is possible to use a hydride gas such as arsine ($AsH_3$) for an As source, and phosphine ($PH_3$) for a P source, etc. In addition, hydrogen selenide ($H_2Se$) or disilane ($Si_2H_6$) can be used for a raw material of an n-type dopant. Meanwhile, bis-cyclopentadienyl magnesium ($Cp_2Mg$) can be used for a raw material of a p-type dopant.

Alternatively, monosilane ($SiH_4$), diethyl-tellurium (DETe) or dimethyl tellurium (DMTe) can be also used as a raw material of the n-type dopant. In addition, dimethyl zinc (DMZn) or diethyl zinc (DEZn) can be also used as a raw material of the p-type dopant.

By forming the buffer layer 200 on the semiconductor substrate 10, it is possible to cancel influence of dopant used for the previous crystal growth (i.e., influence of furnace memory) which remains in a MOVPE apparatus. As a result, it is possible to stably make the epitaxial wafer. In addition, by epitaxially growing the buffer layer 200 on the semiconductor substrate 10, it is possible to improve the crystal quality of the compound semiconductor layer which is epitaxially grown on the buffer layer 200.

Next, the front surface electrode 30 is formed on a surface of the epitaxial wafer, i.e., on a portion of the surface of the current spreading layer 240, by using a photolithography method and a film formation method (e.g., a vacuum deposition method or a sputtering method, etc.) (a front surface electrode formation process). It is possible to use a lift-off method for forming the front surface electrode 30. Subsequently, the back surface electrode 35 is formed on the substantially entire back surface of the semiconductor substrate 10. Furthermore, in order to make ohmic contact between the front surface electrode 30 and the current spreading layer 240 and between the back surface electrode 35 and the back surface of the semiconductor substrate 10, an alloying process is carried out under a predetermined atmosphere (e.g., under an inert atmosphere such as a nitrogen atmosphere, etc.) at a predetermined temperature for predetermined time.

Subsequently, the concavo-convex portion 250 is formed by applying concavo-convex treatment (i.e., roughening treatment) to the surface of the current spreading layer 240 (a concavo-convex portion formation process). In the present embodiment, the roughening treatment is carried out after forming the front surface electrode 30. In addition, the roughening is carried out by applying etching treatment to a surface of the current spreading layer 240 excluding a region where the front surface electrode 30 is formed, using a predetermined etchant. Alternatively, after forming a predetermined mask pattern on the surface of the current spreading layer 240 using a photolithography method, etching treatment can be applied to the surface of the current spreading layer 240 using the formed mask pattern as a mask.

Then, the epitaxial wafer provided with the front surface electrode 30 and the back surface electrode 35 and having the concavo-convex portion 250 formed thereon is dice-cut in accordance with the size of the light-emitting element 1 to be made, thereby making plural light-emitting elements 1. By applying an etching process to an edge face of the plural light-emitting elements 1 after the dicing process, it is possible to remove mechanical damage caused by dicing.

The light-emitting element 1 thus made is, e.g., a light-emitting diode which emits light with an emission wavelength of around 631 nm in a red region. Additionally, a shape of the light-emitting element 1 when viewed from the top is substantially rectangular, and a dimension when viewed from the top is, e.g., 275 μm square.

Effect of the First Embodiment

Since the light-emitting element 1 in the first embodiment is provided with the reflective portion 210 having plural pair layers composed of the first semiconductor layer 210a and the second semiconductor layer 210b of which thicknesses are controlled corresponding to plural incident angles, even if the light is incident to the reflective portion 210 from various incident angles, the reflective portion 210 can reflect the light to the light extracting surface side. Furthermore, since the light-emitting element 1 is provided with the concavo-convex portion 250 on the light extracting surface, it is possible to efficiently extract the light reflected by the reflective portion 210 to the outside of the light-emitting element 1. As a result, it is possible to provide the light-emitting element 1 of the present embodiment with the improved light extraction efficiency.

In addition, in the light-emitting element 1 of the first embodiment, since the concavo-convex portion 250 is formed on the light extracting surface, even the light reflected by the pair layer composed of the first semiconductor layer 210a and the second semiconductor layer 210b having thickness defined by large value of angle θ in the formulas (1) and (2) can be effectively extracted from the light extracting surface. As a result, in the light-emitting element 1 of the first embodiment, for example, compared with the case of composing the reflective portion 210 only by a semiconductor layer corresponding to the emission peak wavelength of the light emitted from the active layer 222, it is possible to improve light output. Therefore, according to the present embodiment, it is possible to provide the high optical output light-emitting element 1 without an increase in the production cost due to an increase in the raw material caused by an increase in total number of the compound semiconductor layers grown on the semiconductor substrate 10 and an increase in the growth time.

Considering from the formulas (3) and (4), when the reflective portion 210 is composed of only a semiconductor layer corresponding to the emission peak wavelength of the light emitted from the active layer 222, normally only the light with a wavelength of about +200 nm can be reflected, however, the reflective portion 210 in the present embodiment can reflect the light within a wavelength range of +300 nm or more with respect to the emission peak wavelength $\lambda_P$ of the light emitted from the active layer 222.

Second Embodiment

FIG. 2 shows an overview of a schematic cross section of a light-emitting element in the second embodiment of the invention.

A light-emitting element 1a in the second embodiment has the same structure as the light-emitting element 1 in the first embodiment, except that a light extracting layer 40 is further provided on the concavo-convex portion 250. Therefore, a detailed explanation will be omitted except for differences.

The light-emitting element 1a is further provided with a light extracting layer 40 on a portion of the current spreading layer 240 opposite to the light emitting portion 20 excluding the front surface electrode 30. The light extracting layer 40 is transparent to the light emitted from the active layer 222, and is formed of a material having a refractive index smaller than that of a semiconductor composing the current spreading layer 240 as well as larger than that of air. When the wavelength of the light emitted from the active layer 222 is defined as $\lambda_P$, a refractive index of a material composing the light extracting layer 40 is defined as n, and a constant is A (A is an odd number), the light extracting layer 40 is formed having a thickness d within a range of ±30% of a value defined by $A+\lambda_P/(4\times n)$.

The light extracting layer 40 can be formed of, e.g., an oxide such as SiN, $SiO_2$, ITO, $Sn_2O_3$, $TiO_2$ or ZnO, etc., or nitride. In addition, a material composing the light extracting layer 40 does not need to have a conductivity type. Furthermore, a conductivity type of the material composing the light extracting layer 40 may be either p-type or n-type.

Since, in the light-emitting element 1a, the light extracting layer 40 having a refractive index between the refractive index of the material composing the current spreading layer 240 and that of the air is provided between the current spreading layer 240 and the external air, it is possible to further improve the light extraction efficiency of the light-emitting element 1a.

Third Embodiment

Figure 3:
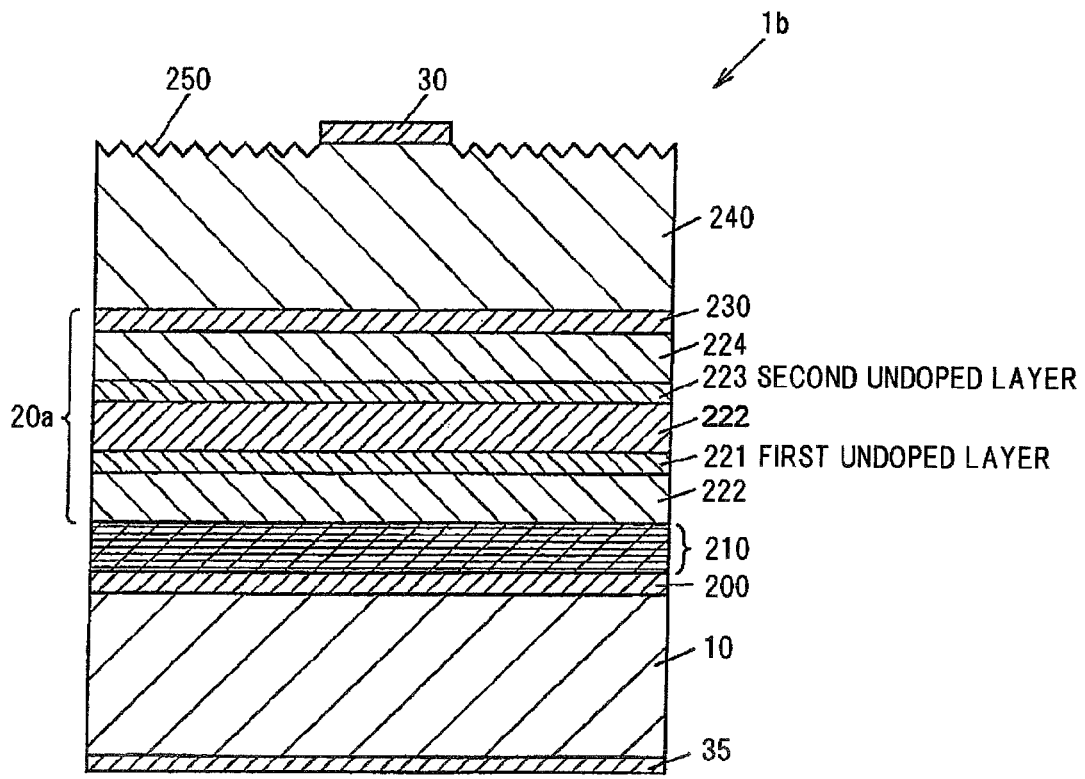
FIG. 3 is a cross sectional view showing a light-emitting element in a third embodiment of the invention.

FIG. 3 shows an overview of a schematic cross section of a light-emitting element in the third embodiment of the invention.

A light-emitting element 1b in the third embodiment has the same structure as the light-emitting element 1 in the first embodiment, except that the active layer 222 is sandwiched between a first undoped layer 221 and a second undoped layer 223. Therefore, a detailed explanation will be omitted except for differences.

In detail, the light-emitting element 1b in the third embodiment is provided with a semiconductor substrate 10, a buffer layer 200 formed on the semiconductor substrate 10, a reflective portion 210 formed on the buffer layer 200, a first cladding layer 220 formed on the reflective portion 210, a first undoped layer 221 formed on the first cladding layer 220, an active layer 222 formed on the first undoped layer 221, a second undoped layer 223 formed on the active layer 222, a second cladding layer 224 formed on the second undoped layer 223, an intermediate layer 230 formed on the second cladding layer 224 and a current spreading layer 240 formed on the intermediate layer 230.

The first undoped layer 221 suppresses dispersion of the n-type dopant contained in the first cladding layer 220 into the active layer 222. Meanwhile, the second undoped layer 223 suppresses dispersion of the p-type dopant contained in the second cladding layer 224 into the active layer 222. The first undoped layer 221 and the second undoped layer 223 are formed of, e.g., $(Al_XGa_{1-X})_YIn_{1-Y}P$ not containing dopant. Since the dispersion of the dopant from the first cladding layer 220 and the second cladding layer 224 into the active layer 222 is suppressed by sandwiching the active layer 222 between the first undoped layer 221 and the second undoped layer 223, it is possible to improve the luminous efficiency in a light emitting portion 20a and to improve the reliability of the light-emitting element 1b.

Although the light-emitting element 1b in the third embodiment is configured to sandwich the active layer 222 between the first undoped layer 221 and the second undoped layer 223, in the modification of the third embodiment, it is possible to form the light-emitting element without forming any one of the first undoped layer 221 and the second undoped layer 223.

Example 1

A light-emitting element, which corresponds to the light-emitting element 1 in the first embodiment and emits red light with an emission peak wavelength around 631 nm, was made as a light-emitting element of Example 1. In detail, firstly, epitaxially grown on an n-type GaAs substrate as the semiconductor substrate 10 having an off-angle of 15° off by MOVPE method were a buffer layer 200 formed of n-type GaAs (doped with Se, carrier concentration of $1\times10^{18}/cm^3$ and film thickness of 200 nm) and a reflective portion 210 including 15 pairs of pair layers composed of an AlAs layer as a first semiconductor layer 210a and an $Al_{0.5}Ga_{0.5}As$ layer as a second semiconductor layer 210b (i.e., 30 layers as a total of 15 layers of the first semiconductor layers 210a and 15 layers of the second semiconductor layers 210b). The carrier concentration of each semiconductor layer composing the reflective portion 210 is controlled to about $1\times10^{18}/cm^3$.

Furthermore, an n-type $(Al_{0.7}Ga_{0.3})_{0.5}In_{0.5}P$ cladding layer as the first cladding layer 220 (doped with Se, carrier concentration of $4\times10^{17}/cm^3$ and film thickness of 400 nm), an undoped $(Al_{0.1}Ga_{0.9})_{0.5}In_{0.5}P$ active layer as the active layer 222 (film thickness of 600 nm), a p-type $(Al_{0.7}Ga_{0.3})_{0.5}In_{0.5}P$ cladding layer as the second cladding layer 224 (doped with Mg, carrier concentration of $2\times10^{17}/cm^3$ and film thickness of 500 nm), a p-type $Ga_{0.7}In_{0.3}P$ intermediate layer as the intermediate layer 230 (doped with Mg, carrier concentration of $6\times10^{18}/cm^3$ and film thickness of 20 nm) and a p-type GaP current spreading layer as the current spreading layer 240 (doped with Mg, carrier concentration of $2\times10^{18}/cm^3$ and film thickness of 8000 nm) were sequentially epitaxially grown on the reflective portion 210. Thus, the epitaxial wafer for the light-emitting element in Example 1 was made.

The growth temperature by the MOVPE growth was set to 650° C. from the growth of the buffer layer formed of n-type GaAs to the growth of the p-type $Ga_{0.7}In_{0.3}P$ intermediate layer, and was set to 675° C. for the growth of the p-type GaP current spreading layer. In addition, as for the other growth conditions, growth pressure was set to 6666.1 Pa (50 Torr) and each growth rate of plural compound semiconductor layers was set to 0.3-1.5 nm/sec. In addition, a V/III ratio was set to around 150. In this regard, however, the V/III ratio for growing the p-type GaP current spreading layer was set to 25. Since the raw materials, etc., used for the MOVPE growth was explained in the first embodiment, the detail explanation is omitted.

Here, the reflective portion 210 will be explained in detail. Thicknesses of the AlAs layer as the first semiconductor layer 210a and the $Al_{0.5}Ga_{0.5}As$ layer as the second semiconductor layer 210b in the plural pair layers of the reflective portion 210 were each controlled to a thickness calculated by the formulas (1) and (2). In other words, the emission peak wavelength "631 nm" of the light discharged from the undoped $(Al_{0.1}Ga_{0.9})_{0.5}In_{0.5}P$ active layer was used as $\lambda_P$, the refractive index of the AlAs layer "3.114" was used as $n_A$, the refractive index of the $Al_{0.5}Ga_{0.5}As$ layer "3.507" was used as $n_B$, and the refractive index of the n-type $(Al_{0.7}Ga_{0.3})_{0.5}In_{0.5}P$ cladding layer "3.127" was used as $n_{In}$. Furthermore, 0°, 20°, 30°, 40°, 50°, 60° and 70° were used as the angle θ in the formulas (1) and (2).

In detail, a structure of the reflective portion 210 formed on the epitaxial wafer for the light-emitting element in Example 1 is as follows. Namely, firstly, two pairs of the pair layers composed of an AlAs layer and an $Al_{0.5}Ga_{0.5}As$ layer having a thickness calculated by the formulas (1) and (2) setting 0 to 70° (hereinafter referred to as "a 70° DBR layer") were formed on an n-type GaAs buffer layer. Next, two pairs of the pair layers composed of an AlAs layer and an $Al_{0.5}Ga_{0.5}As$ layer having a thickness calculated by the formulas (1) and (2) setting 0 to 60° (hereinafter referred to as "a 60° DBR layer") were formed on the 70° DBR layer. Then, one pair of the pair layers composed of an AlAs layer and an $Al_{0.5}Ga_{0.5}As$ layer having a thickness calculated by the formulas (1) and (2) setting 0 to 50° (hereinafter referred to as "a 50° DBR layer") was formed on the 60° DBR layer.

Furthermore, one pair of the pair layers composed of an AlAs layer and an $Al_{0.5}Ga_{0.5}As$ layer having a thickness calculated by the formulas (1) and (2) setting 0 to 40° (hereinafter referred to as "a 40° DBR layer") was formed on the 50° DBR layer. Then, two pairs of the pair layers composed of an AlAs layer and an $Al_{0.5}Ga_{0.5}As$ layer having a thickness calculated by the formulas (1) and (2) setting 0 to 30° (hereinafter referred to as "a 30° DBR layer") were formed on the 40° DBR layer.

Furthermore, six pairs of the pair layers composed of an AlAs layer and an $Al_{0.5}Ga_{0.5}As$ layer having a thickness calculated by the formulas (1) and (2) setting 0 to 20° (hereinafter referred to as "a 20° DBR layer") were formed on the 30° DBR layer. Then, one pair of the pair layers composed of an AlAs layer and an $Al_{0.5}Ga_{0.5}As$ layer having a thickness calculated by the formulas (1) and (2) setting 0 to 0° (hereinafter referred to as "a 0° DBR layer") was formed as an uppermost layer on the 20° DBR layer. It should be noted that, as for the 0° DBR layer, when the emission peak wavelength is defined as $\lambda_P$, the refractive index of the first semiconductor layer 210a is defined as $n_A$ and the refractive index of the second semiconductor layer 210b is defined as $n_B$, it is possible to calculate the thicknesses of the first semiconductor layer 210a and the second semiconductor layer 210b from the $\lambda_P/4n_A$ and $\lambda_P/4n_B$. The reflective portion 210 having 15 pairs of such pair layers was formed on the n-type GaAs buffer layer.

Since a below-described reflective portion 212 of a light-emitting element in Comparative Example is formed having 21 pairs of pair layers (note: the thickness of the reflective portion 212 is slightly more than about 2000 nm), the number of plural pair layers in the reflective portion 210 of the light-emitting element 1 in Example 1 was determined to 15 (note: the thickness of the reflective portion 210 is slightly less than about 2000 nm) in order to compare the light-emitting element in Example 1 with that in Comparative Example 1 by forming the reflective portion 210 so as to have a thickness equivalent to the light-emitting element in Comparative Example 1.

After taking out the thus made epitaxial wafer for the light-emitting element in Example 1 from the MOVPE apparatus, a front surface electrode 30 having a circular portion with a diameter of 100 μm and four leg portions extending from an outer edge of the circular portion was formed on a surface of the epitaxial wafer (i.e., an upper surface of the wafer as well as a surface of the current spreading layer) so as to be arranged in a matrix shape. The photolithography method was used for forming the front surface electrode 30. In other words, after applying photoresist on the surface of the epitaxial wafer, a mask pattern having openings in each region for forming plural front surface electrodes 30 was formed on the surface of the epitaxial wafer by the photolithography method using a mask aligner. After that, 400 nm thick AuBe, 10 nm thick Ni and 1000 nm thick Au were sequentially deposited in the opening using the vacuum deposition method. After the deposition, the mask pattern formed on the epitaxial wafer was removed by the lift-off method, which results in that the front surface electrode 30 was formed on the surface of the epitaxial wafer.

Next, the back surface electrode 35 was formed on a back surface of the epitaxial wafer, i.e., the entire surface opposite to the surface where the front surface electrode 30 is formed, using the vacuum deposition method. The back surface electrode 35 was formed by depositing 60 nm thick AuGe, 10 nm thick Ni and 500 nm thick Au in this order. After forming the front surface electrode 30 and the back surface electrode 35, an alloying process for alloying the electrodes was carried out. In detail, the epitaxial wafer having the front surface electrode 30 and the back surface electrode 35 formed thereon was heated in a nitrogen gas atmosphere at 400° C. for 5 minutes. As a result, the epitaxial wafer with electrode for light-emitting element in Example 1 was made.

Example 2

A light-emitting element provided with a reflective portion 210 different from that of the Example 1 was made as a light-emitting element in Example 2. Since the structure is the same as that of Example 1 except the reflective portion 210, the detailed explanation will be omitted except for differences.

The structure of the reflective portion 210 provided in the light-emitting element in Example 2 is as follows. Namely, the reflective portion 210 in Example 2 was formed by sequentially growing two pairs of 70° DBR layers, two pairs of 60° DBR layers, one pair of 50° DBR layers, one pair of 40° DBR layers, three pairs of 30° DBR layers, four pairs of 20° DBR layers, one pair of 10° DBR layers and one pair of 0° DBR layers from the n-type GaAs buffer layer side. It should be noted that the 0° DBR layer indicates a pair layer composed of the first semiconductor layer 210a and the second semiconductor layer 210b having a thickness calculated by substituting for "0" in the value θ in the formulas (1) and (2). The number of plural pair layers included in the reflective portion 210 is 15 pairs and the thickness of the reflective portion 210 is slightly less than about 2000 nm. The other structure is the same as the Example 1.

The epitaxial wafers with electrode for the light-emitting elements in Examples 1 and 2 were made as described above.

Roughness of Concavo-Convex Portion 250

Next, the epitaxial wafers with electrode for the light-emitting elements in Examples 1 and 2 were divided into four by cleavage for making ¼ size chips. One ¼ size chip made from the epitaxial wafer with electrode for the light-emitting element in Example 1 and one ¼ size chip made from the epitaxial wafer with electrode for the light-emitting element in Example 2 were each stored as they were, for comparison purpose. On the other hand, as for three ¼ size chips made from the epitaxial wafer with electrode for the light-emitting element in Example 1 and three ¼ size chips made from the epitaxial wafer with electrode for the light-emitting element in Example 2, concavo-convex treatment (roughening treatment) was applied to the surface of the current spreading layer excluding a region where the front surface electrode 30 is formed.

The roughening treatment was carried out using acetic acid etching solution. Three patterns of concavo-convex treatments (roughening) were carried out by changing etching time (roughening treatment time). In other words, the concavity and convexity on the surface of the current spreading layer were formed in different shapes by changing the etching time (roughening treatment time). Three patterns of etching times (roughening treatment time), which are 15 seconds, 30 seconds and 60 seconds, were carried out for each ¼ size chip made from the epitaxial wafers with electrode for the light-emitting elements in Examples 1 and 2. As a result of evaluating concavity and convexity on the surface of the current spreading layer etched by changing the etching time (roughening treatment time), the arithmetic mean roughness Ra was not less than 0.04 μm and not more than 0.25 μm and the root mean square roughness RMS of not less than 0.05 μm and not more than 0.35 μm.

Figure 4:
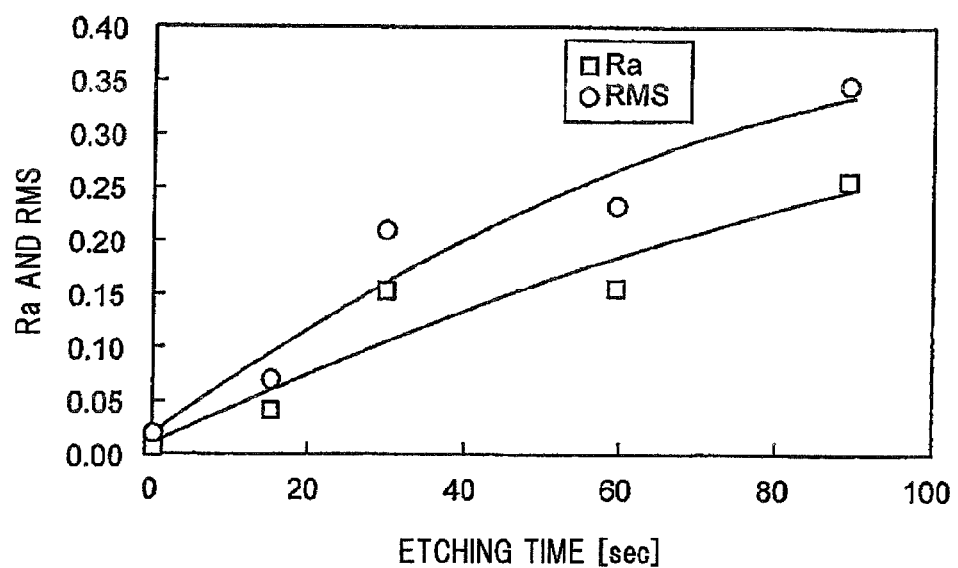
FIG. 4 is a view showing a relation between time for applying roughening treatment to an epitaxial wafer with electrode and surface roughness.

FIG. 4 is a view showing a relation between time for applying roughening treatment to an epitaxial wafer with electrode and surface roughness.

FIG. 4 also shows surface roughness in the case where the roughening treatment is carried out with the etching time (roughening treatment time) changed to 90 seconds. As understood from FIG. 4, it was shown that both of Ra and RMS become 0.04 μm or more by setting the etching time (roughening treatment time) to 15 seconds or more.

Structure of Reflective Portion 210

Figure 5A:
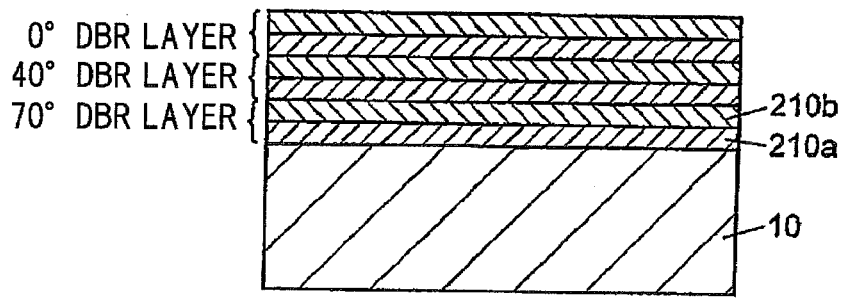
FIG. 5A is a view showing a simplified structure of a reflective portion provided in a light-emitting element in Example 1.
Figure 5B:
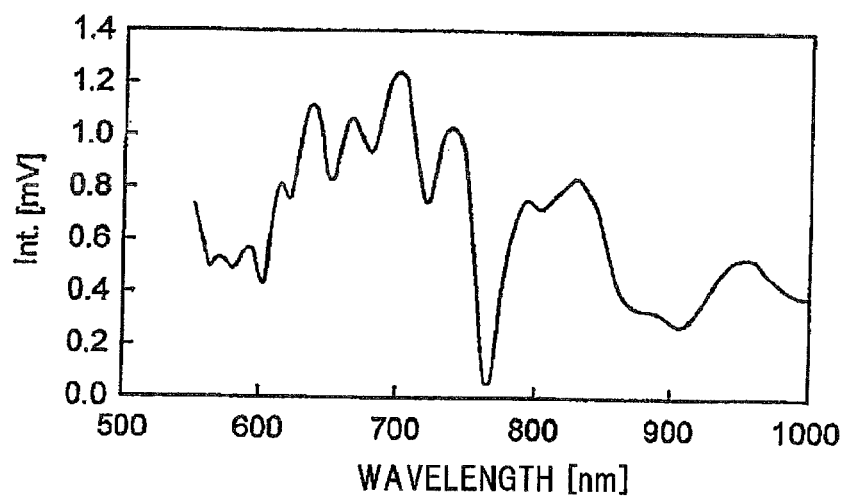
FIG. 5B is a view showing a reflectance spectrum in a simplified structure of the reflective portion provided in a light-emitting element in Example 1.

FIG. 5A shows a simplified structure of a reflective portion provided in a light-emitting element in Example 1 and FIG. 5B shows a reflectance spectrum in the simplified structure of the reflective portion provided in a light-emitting element in Example 1. In addition, FIG. 6A shows a simplified structure of a reflective portion provided in a light-emitting element in Comparative Example and FIG. 6B shows a reflectance spectrum in the simplified structure of the reflective portion provided in a light-emitting element in Comparative Example.

As understood from FIG. 5A, a simplified structure of the reflective portion 210 provided in the light-emitting element in Example 1 includes a structure in which the 70° DBR layer, the 40° DBR layer and the 0° DBR layer are formed on the n-type GaAs substrate as the semiconductor substrate 10 in this order. When the reflectance spectrum of the reflective portion 210 in such a structure was measured, it was shown that light with various wavelengths is reflected as shown in FIG. 5B.

Figure 6A:
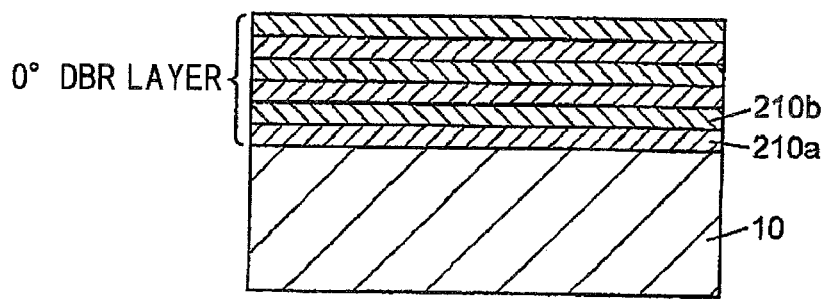
FIG. 6A is a view showing a simplified structure of a reflective portion provided in a light-emitting element in Comparative Example.
Figure 6B:
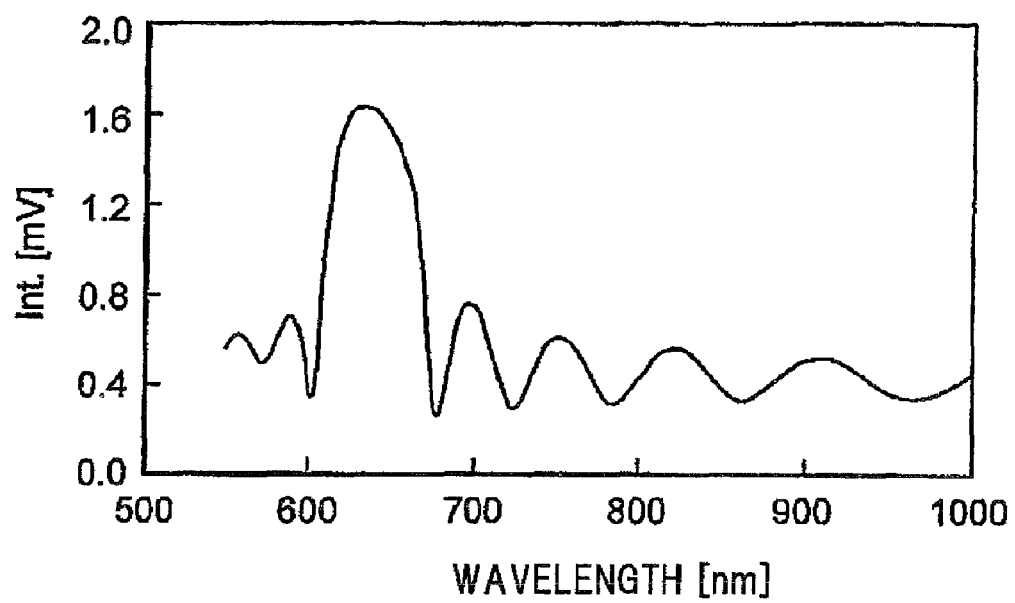
FIG. 6B is a view showing a reflectance spectrum in a simplified structure of the reflective portion provided in a light-emitting element in Comparative Example.

On the other hand, as understood from FIG. 6A, a simplified structure of the reflective portion provided in the light-emitting element in Comparative Example includes a structure in which three 0° DBR layers are formed on the n-type GaAs substrate as the semiconductor substrate 10. When the reflectance spectrum of the reflective portion in such a structure was measured, it was shown that only the light with a wavelength having a peak wavelength of around 640 nm is mainly reflected as shown in FIG. 6B.

Light-emitting Element

Following this, the stored one ¼ size chip made from the epitaxial wafer for the light-emitting element in Example 1, the one ¼ size chip made from the epitaxial wafer for the light-emitting element in Example 2, the three ¼ size chips in Example 1 to which the roughening treatment is applied (i.e., chips of which surfaces are roughened by respectively applying etching for 15 seconds, 30 seconds and 60 seconds) and the three ¼ size chips in Example 2 to which the roughening treatment is applied (i.e., chips of which surfaces are roughened by respectively applying etching for 15 seconds, 30 seconds and 60 seconds) were each cut using a dicing device so as to center the front surface electrode 30.

As a result, two types of non-roughened LED bare chips for comparison purpose (i.e., a LED bare chip for comparison purpose made from the epitaxial wafer with electrode for the light-emitting element in Example 1 and a bare chip for comparison purpose made from the epitaxial wafer with electrode for the light-emitting element in Example 2), three types of LED bare chips in Example 1 (i.e., the three LED bare chips to which the roughening treatments for 15 seconds, 30 seconds and 60 seconds are applied), and three types of LED bare chips in Example 2 (i.e., the three LED bare chips to which the roughening treatments for 15 seconds, 30 seconds and 60 seconds are applied) were made. The chip size is 275 μm square for each.

Next, each of the made LED bare chips was bonded to a TO-18 stem using Ag paste. Then, the front surface electrode 30 of the LED bare chip mounted on the TO-18 stem was wire-bonded using a wire formed of Au, thus, the light-emitting elements in Examples 1 and 2 as well as the light-emitting elements for comparison with Examples 1 and 2 were each made.

Example 3

A light-emitting element provided with a reflective portion 210 different from that of the Example 2 was made as a light-emitting element in Example 3. Since the structure is the same as that of Example 2 except the reflective portion 210, the detailed explanation will be omitted except for differences.

The structure of the reflective portion 210 provided in the light-emitting element in Example 3, which is a reversed structure of the reflective portion 210 in Example 2, is as follows. Namely, the reflective portion 210 in Example 3 was formed by sequentially growing one pair of 0° DBR layers, one pair of 10° DBR layers, four pairs of 20° DBR layers, three pairs of 30° DBR layers, one pair of 40° DBR layers, one pair of 50° DBR layers, two pairs of 60° DBR layers and two pairs of 70° DBR layers from the n-type GaAs buffer layer side. The other structure is the same as the Example 2. Then, the light-emitting element in Example 3 was made in the same manner as Examples 1 and 2.

Example 4

Figure 7:
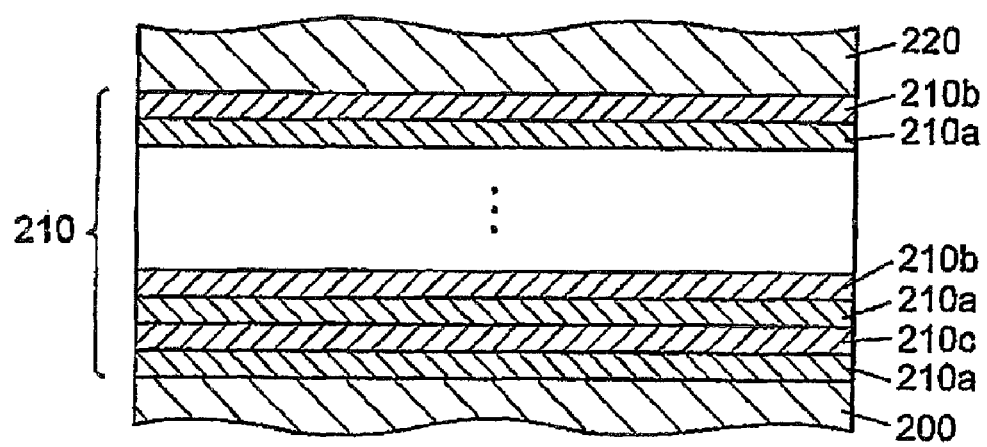
FIG. 7 is a view showing an overview of a reflective portion of a light-emitting element in Example 4 and a modification thereof.

FIG. 7 is a view showing an overview of a reflective portion of a light-emitting element in Example 4 and a modification thereof.

A light-emitting element provided with a reflective portion 210 different from that of the Examples 1 and 2 was made as a light-emitting element in Example 4 and a modification of Example 4. Since the structure of the light-emitting elements in Example 4 and the modification of Example 4 is the same as that of Examples 1 and 2 except the reflective portion 210, the detailed explanation will be omitted except for differences.

In the light-emitting element in Example 4, one of the two pairs of 70° DBR layers of the reflective portion 210 in Example 1 is composed of an AlAs layer as a first semiconductor layer 210a and a GaAs layer as a second semiconductor layer 210c. Other pair layers are the same as the pair layers of the reflective portion 210 in Example 1. Meanwhile, in the light-emitting element in the modification of Example 4, the one pair of 0° DBR layers of the reflective portion 210 in Example 3 is composed of an AlAs layer as a first semiconductor layer 210a and a GaAs layer as a second semiconductor layer 210c. Other pair layers are the same as the pair layers of the reflective portion 210 in Example 3. Then, the light-emitting elements in Example 4 and the modification of Example 4 were made in the same manner as Examples 1 and 2.

Figure 8:
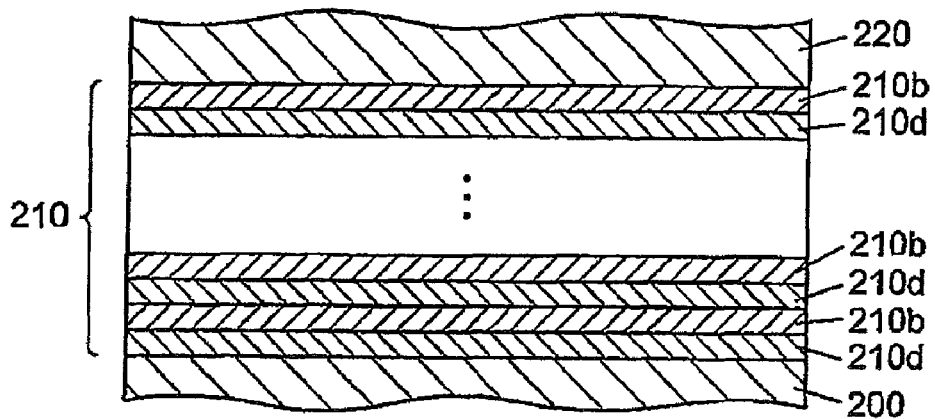
FIG. 8 is a view showing an overview of a reflective portion of a light-emitting element in Example 5.

FIG. 8 is a view showing an overview of a reflective portion of a light-emitting element in Example 5.

A light-emitting element provided with a reflective portion 210 different from that of the Example 1 was made as a light-emitting element in Example 5. Since the structure of the light-emitting element in Example 5 is the same as that of Example 1 except the reflective portion 210, the detailed explanation will be omitted except for differences.

In the light-emitting element in Example 5, the reflective portion 210 was formed replacing the all AlAs layers as the first semiconductor layer of the reflective portion 210 in Example 1 with $Al_{0.5}In_{0.5}P$ layers as a first semiconductor layer 210d. The other structure is the same as the Example 1. Then, the light-emitting element in Example 5 was made in the same manner as Examples 1 and 2.

Comparative Example 1

Figure 9:
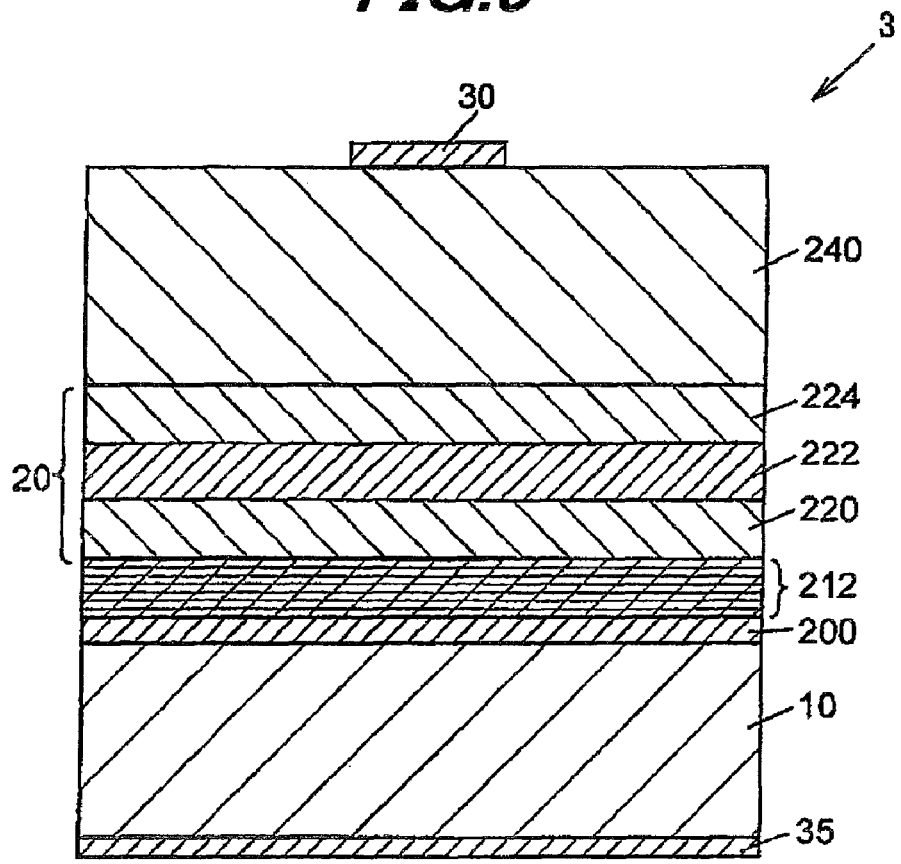
FIG. 9 is a cross sectional view showing a light-emitting element in Comparative Example 1.
Figure 10:
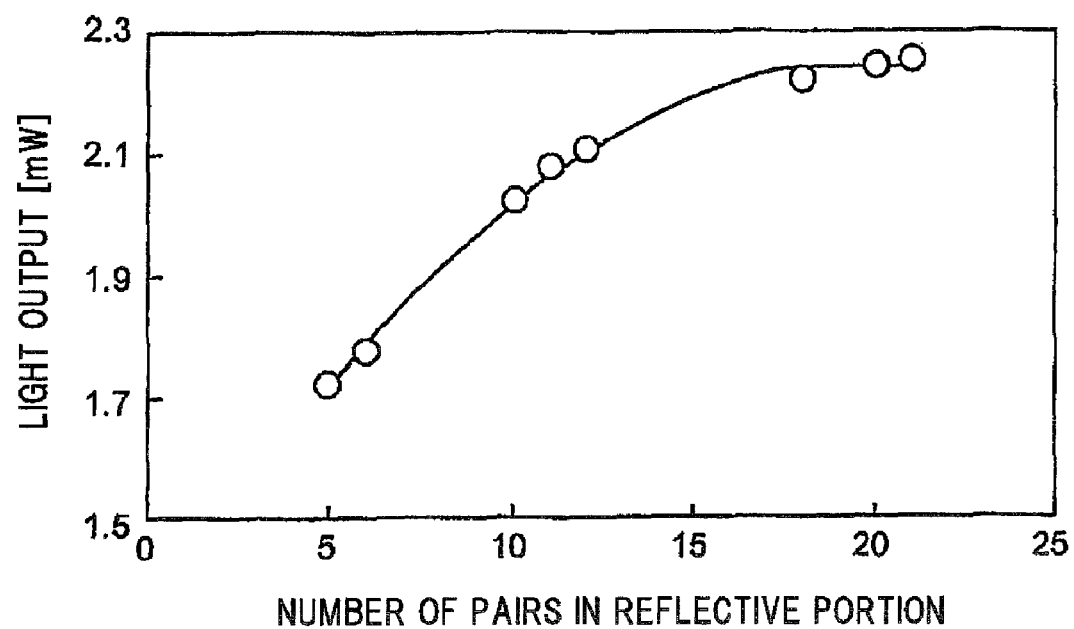
FIG. 10 is a view showing the light output of the light-emitting element in Comparative Example 1 according to the different number of the pairs in the reflective portion.

FIG. 9 shows an overview of a schematic cross section of a light-emitting element in Comparative Example 1, and FIG. 10 shows light output of the light-emitting element in Comparative Example 1 according to the different number of the pairs in the reflective portion.

The light-emitting element in Comparative Example 1 has the same structure as Example 1 except that the structure of the reflective portion 212, etc., is different. Therefore, a detailed explanation will be omitted except for differences from the light-emitting element in Example 1.

Firstly, the reflective portion 212 of the light-emitting element in Comparative Example 1 has plural pair layers composed of an AlAs layer as a first semiconductor layer and an $Al_{0.5}Ga_{0.5}As$ layer as a second semiconductor layer. In Comparative Example 1, the thicknesses of the first and second semiconductor layers were controlled to a thickness calculated from $\lambda_P/4n$. Here, $\lambda_P$ is an emission peak wavelength of the light emitted from the active layer 222, and n is a refractive index of the first or second semiconductor layer.

In detail, since the emission peak wavelength is 631 nm, the thickness $T_A$ of the AlAs layer as a first semiconductor layer in Comparative Example 1 is $T_A=631/4\times3.114$ (note: 3.114 is a refractive index of the AlAs layer), which is 50.7 nm. In addition, the thickness $T_B$ of the $Al_{0.5}Ga_{0.5}As$ layer as a second semiconductor layer in Comparative Example 1 is $T_B=631/4\times3.507$ (note: 3.507 is a refractive index of the $Al_{0.5}Ga_{0.5}As$ layer), which is 45.0 nm. Therefore, the light-emitting element in Comparative Example 1 was made so as to include the reflective portion 212 having the pair layer composed of the first and second semiconductor layers having such thicknesses.

In addition, when the pair number of the pair layers included in the reflective portion 212 was variously changed, as understood from FIG. 10, it was shown that the light output of the light-emitting element in Comparative Example 1 is saturated when the pair number of the pair layers included in the reflective portion 212 is 20 or more. Therefore, the pair number of the pair layers in the reflective portion 212 was determined to be 20 or more. In this regard, however, the number of pairs was controlled so that the thickness of the reflective portion 212 becomes about 2000 nm. In detail, the pair number of the pair layers in the reflective portion 212 in Comparative Example 1 was determined to be 21. The thickness of the reflective portion 212 was 2010 nm.

In addition, not only a light-emitting element not provided with a concavo-convex portion 250 but also a light-emitting element provided with a concavo-convex portion 250 were made as a light-emitting element in Comparative Example 1. In detail, in the same manner as Examples 1 and 2, the epitaxial wafer with electrode for light-emitting element was divided into four for making a chip to which the roughening treatment is not applied and three types of chips to which the roughening treatment is applied by changing etching time (roughening treatment time). The etching time (roughening treatment time) is varied in three patterns, which are 15 seconds, 30 seconds and 60 seconds, in the same manner as Examples 1 and 2. It was confirmed that the surface of the current spreading layer formed by the roughening treatment has the same level of Ra and RMS as Examples 1 and 2. Table 1 shows emission characteristics of the light-emitting element in Comparative Example 1.

TABLE 1

| | Roughening treatment time (sec) | | | |
| --- | --- | --- | --- | --- |
| | 0 | 15 | 30 | 60 |
| Light output (mW) in Comparative Example 1 | 2.250 | 2.042 | 2.041 | 2.077 |
| Comparison (%) | 100.0 | 90.8 | 90.7 | 92.3 |

As shown in Table 1, the light output of the light-emitting element in Comparative Example 1 was 2.25 mW in the element to which to which the roughening treatment was not applied, i.e., the element not provided with a concavo-convex portion. Meanwhile, it was confirmed that the light output of the element to which the roughening treatment was applied was about 10% lower than that of the element not provided with a concavo-convex portion. In other words, it was shown that, in the light-emitting element in Comparative Example 1, the light output decreases when the roughening treatment is applied to the surface of the current spreading layer.

Comparative Example 2

The epitaxial wafer for the light-emitting element made in Example 1 was used as the light-emitting element in Comparative Example 2, and the roughening treatment was applied to the surface of the current spreading layer 240 before forming the front surface electrode 30 thereon. In other words, the difference from the Example 1 is that the roughening treatment is carried out before forming the front surface electrode 30. Since other structure, etc., of the light-emitting element is the same as the Example 1, the detailed explanation will be omitted.

An initial characteristic of the light-emitting element in Comparative Example 2 was evaluated. As a result, forward voltage (Vf) of the light-emitting element in Comparative Example 2 was 2.5V or more. In other words, it was shown that, when the concavo-convex portion 250 is formed on the surface of the current spreading layer 240 by carrying out the roughening treatment before forming the front surface electrode 30, the forward voltage (Vf) increases.

Characteristic Evaluation of Examples 1, 2 and Comparative Example 1

Table 2 shows a result of evaluating the initial characteristic of the light-emitting elements in Examples 1 and 2 made as described above. Each of the light-emitting elements used for the evaluation is an element taken out from the vicinity of the center of the epitaxial wafer. In addition, Table 2 also shows an evaluation result of the light-emitting elements in Comparative Example 1. The light output in Table 2 is measured at the electric current of 20 mA.

TABLE 2

| | Roughening treatment time (sec) | | | |
| --- | --- | --- | --- | --- |
| | 0 | 15 | 30 | 60 |
| Light output (mW) of light-emitting element made from epitaxial wafer with electrode for light-emitting element in Example 1 | 2.163 | 2.753 | 2.755 | 2.794 |
| Light output (mW) of light-emitting element made from epitaxial wafer with electrode for light-emitting element in Example 2 | 2.102 | 2.662 | 2.643 | 2.721 |
| Light output (mW) of light-emitting element made from epitaxial wafer with electrode for light-emitting element in Comparative Example 1 | 2.250 | 2.042 | 2.041 | 2.077 |

Referring to Table 2, the light output of the light-emitting element made from a LED bare chip for comparison purpose made from the epitaxial wafer with electrode for the light-emitting element in Example 1 (i.e., a chip not provided with the concavo-convex portion 250) was 2.163 mW, and the light output of the light-emitting element made from a LED bare chip for comparison purpose made from the epitaxial wafer with electrode for the light-emitting element in Example 2 (i.e., a chip not provided with the concavo-convex portion 250) was 2.102 mW. This shows that the light output decreases about 4% to 7% than that of the light-emitting element in Comparative Example 1.

However, as for a light-emitting element made from three types of LED bare chips in Example 1 having a concavo-convex portion formed thereon by applying the roughening treatment (i.e., three types of LED bare chips to which the roughening treatments for 15 seconds, 30 seconds and 60 seconds are respectively applied) and a light-emitting element made from three types of LED bare chips in Example 2 (i.e., three types of LED bare chips to which the roughening treatments for 15 seconds, 30 seconds and 60 seconds are respectively applied), the light output was not less than 2.643 mW nor more than 2.794 mW and it was shown that the light output was improved about 18% to 24% than that of Comparative Example 1. As a result, it was shown that it is possible to provide a light-emitting element, in which the light output is 1.2 times of that of the light-emitting element in Example 1, without increasing the production cost.

It should be noted that, since the reflective portion 210 has plural layers and the concavo-convex portion 250 is formed on the surface of the current spreading layer 240 in Examples 1 and 2, there is a possibility that the emission peak wavelength of the light-emitting element varies. However, as shown in Table 3, the emission peak wavelength fell within a range of ±1 nm and no large variation was found.

TABLE 3

| | Roughening treatment time (sec) | | | |
| --- | --- | --- | --- | --- |
| | 0 | 15 | 30 | 60 |
| Emission peak wavelength (nm) of light-emitting element made from epitaxial wafer with electrode for light-emitting element in Example 1 | 634.1 | 634.3 | 634.8 | 634.5 |
| Emission peak wavelength (nm) of light-emitting element made from epitaxial wafer with electrode for light-emitting element in Example 2 | 634.1 | 634.3 | 634.7 | 634.3 |
| Emission peak wavelength (nm) of light-emitting element made from epitaxial wafer with electrode for light-emitting element in Comparative Example 1 | 634.5 | 634.5 | 633.6 | 634.3 |

Furthermore, the forward voltage (Vf) of the light-emitting element in Examples 1 and 2 was about 1.88V as shown in Table 4, and it was confirmed that the forward voltage is sufficiently low for practical use. Referring to Table 4, it was shown that the forward voltage is slightly lower than that of the light-emitting element in Comparative Example. It is attributed to the fact that a heterojunction interface between the first and second semiconductor layers decreases due to the pair number of the pair layers in the reflective portion 210 in Examples 1 and 2 smaller than the number of pairs in the reflective portion of the light-emitting element in Comparative Example.

TABLE 4

| | Roughening treatment time (sec) | | | |
| --- | --- | --- | --- | --- |
| | 0 | 15 | 30 | 60 |
| Forward voltage (V) of light-emitting element made from epitaxial wafer with electrode for light-emitting element in Example 1 | 1.871 | 1.879 | 1.875 | 1.876 |
| Forward voltage (V) of light-emitting element made from epitaxial wafer with electrode for light-emitting element in Example 2 | 1.874 | 1.878 | 1.876 | 1.879 |
| Forward voltage (V) of light-emitting element made from epitaxial wafer with electrode for light-emitting element in Comparative Example 1 | 1.880 | 1.880 | 1.879 | 1.882 |

Reliability Evaluation

In addition, reliability evaluation was carried out for the light-emitting element made from a LED bare chip for comparison purpose made from the epitaxial wafer with electrode for the light-emitting element in Example 1 (i.e., a chip not provided with the concavo-convex portion 250), the light-emitting element made from a LED bare chip for comparison purpose made from the epitaxial wafer with electrode for the light-emitting element in Example 2 (i.e., a chip not provided with the concavo-convex portion 250) and light-emitting elements in Examples 1 and 2 (i.e., each of three types of light-emitting elements in each of Examples 1 and 2 in which the etching time for the roughening treatment applied thereto is different).

In detail, a reliability test was carried out under a condition at a room temperature at electric current of 50 mA for 168 hours for the evaluation. As a result of the reliability test, relative output was from 100% to 105% in each light-emitting element. The relative output was calculated from: the light output after 168 hours of electrification/initial light output× 100. Therefore, it was shown that the light-emitting elements in Examples 1 and 2 achieve the same level of reliability as the light-emitting element in which the roughening treatment is not applied to the surface of the current spreading layer 240.

From the above, in the light-emitting elements in Examples 1 and 2, the light output could be increased about 1.2 times at low cost while maintaining the emission characteristics. Although the cost is increased due to the etching during the roughening treatment, it is possible to reduce the influence of an increase in the cost by batch process to multiple epitaxial wafers with electrode.

SUMMARY OF EXAMPLES

When comparing the light-emitting element in Comparative Example 1 with the light-emitting elements in Examples 1 to 5, the light output decreases in the light-emitting element in Comparative Example 1 when the surface of the current spreading layer was roughened. Therefore, it was shown that the light-emitting element is required to include the structure in Examples 1 to 5 in order to improve the light output by roughening the surface of the current spreading layer.

In Case of Example 3

It was configured that, also in the light-emitting element in Example 3, the light output becomes 1.2 times of the case where a concavo-convex portion is not formed on the surface of the current spreading layer, in the same manner as the light-emitting element in Example 1. In addition, other LED characteristics such as emission wavelength, Vf and reliability, etc., were also equivalent to those of the light-emitting element in Example 1. Therefore, it was confirmed that it is possible to obtain a light-emitting element having good optical output characteristics even if the plural pair layers composing the reflective portion 210 is conversely configured relative to the structure in Example 2.

In Case of Example 4 and Modification of Example 4

It was confirmed that, also in the light-emitting element in Example 4 and the light-emitting element in the modification of Example 4, it is possible to obtain the characteristics equivalent to the light-emitting elements in Examples 1 and 2. In addition, it was confirmed that about 1.25 times of light output is obtained compared with Comparative Example 1. Here, the reason why the optical output is improved than the light-emitting elements in Examples 1 and 2 is as follows. Namely, a refractive index difference between the AlAs layer as the first semiconductor layer 210a and the GaAs layer as the second semiconductor layer 210c is larger than that between the AlAs layer and the $Al_{0.5}Ga_{0.5}As$ layer, which results in that reflectance at the reflective portion 210 is improved.

In this regard, however, the GaAs layer is, e.g., not transparent to red light and absorbs red light. Therefore, when the entire second semiconductor layer is the GaAs layer, the light output tends to decrease due to light absorption by the GaAs layer. Therefore, in Example 4, the second semiconductor layer of lowermost layer of the reflective portion 210, i.e., a pair layer formed at a position farthest from the light emitting portion 20 (in other words, a pair layer formed at a position closest to the semiconductor substrate 10) is preferably a GaAs layer from a viewpoint of improving the optical output. This is because, the inventor obtained the knowledge that, when the pair number of the pair layers in the reflective portion 210 is not increased, it is preferable to consider improvement in the reflectance rather than to consider the light absorption of the pair layer located at lowermost portion.

In Case of Example 5

The light output of the light-emitting element in Example 5 was about 1.1 times of that of the light-emitting element in Comparative Example 1, thus, the improved degree of the light output was small compared with Examples 1 to 4. Thus, a light-emitting element in a modification of Comparative Example 1 in which a first semiconductor layer in the reflective portion 210 is changed from the AlAs layer to the $Al_{0.5}In_{0.5}P$ layer was made in the same manner as the Example 5. It was shown that the light output of the light-emitting element in the modification of Comparative Example 1 is lower than that of the light-emitting element in Example 1. In addition, it was confirmed that the light output of the light-emitting element in Example 5 is about 1.2 times of that of the light-emitting element in the modification of Comparative Example 1.

In other words, it was shown that the reason why the light output of the light-emitting element in Example 5 is about 1.1 times of that of the light-emitting element in Comparative Example 1 is that the entire first semiconductor layer 210d of the reflective portion 210 is formed of the $Al_{0.5}In_{0.5}P$ layer. In detail, it is attributed to the fact that, since the refractive index of the $Al_{0.5}In_{0.5}P$ layer is larger than that of the AlAs layer, the refractive index difference between the first and second semiconductor layers becomes small, and the reflectance of the reflective portion 210 in Example 5 is decreased as a result.

Therefore, also in the light-emitting element in Example 5, it was shown that, even if the light is incident at various incident angles, it is possible to reflect such light to the light extracting surface side by providing the reflective portion 210 having plural pair layers composed of the first semiconductor layer 210d and the second semiconductor layer 210b of which thicknesses are controlled corresponding to plural incident angles, and it is possible to improve the light extraction efficiency of the element by the concavo-convex portion 250 formed on the light extracting surface which efficiently extracts the light reflected by the reflective portion 210 to the outside of the light-emitting element.

Comparison with Comparative Example 2

While Vf of the light-emitting elements in Examples 1 and 2 was about 1.88V, Vf of the light-emitting element in Comparative Example 2 was 2.5V. In other words, it was confirmed that the forward voltage increases when the roughening treatment of the current spreading layer 240 is carried out before forming the front surface electrode 30. Therefore, it was shown that the roughening treatment is preferably carried out after forming the front surface electrode 30.

Although the detailed reason that the forward voltage was increased in Comparative Example 2 is not clear, the following reasons are considered. Namely, when the roughening treatment is carried out before forming the front surface electrode 30, the surface of the current spreading layer 240 becomes concave and convex. Therefore, one potential reason is that an electrode material composing the front surface electrode does not enter a detail portion of the concavo-convex portion 250 when the front surface electrode 30 is formed after the roughening treatment. In addition, the possibility that the surface of the current spreading layer 240 is changed into an unexpected shape by roughening etching thereto, or the possibility that the etching solution remains in a concave portion of the concavo-convex portion 250 are also considered as reasons.

Although the embodiments of the invention has been described, the invention according to claims is not to be limited to the above-mentioned embodiments and examples. Further, please note that not all combinations of the features described in the embodiments and examples are not necessary to solve the problem of the invention.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A light-emitting element, comprising: a semiconductor substrate; a light emitting portion comprising an active layer sandwiched between a first cladding layer of a first conductivity type and a second cladding layer of a second conductivity type different from the first conductivity type;
   a reflective portion provided between the semiconductor substrate and the light emitting portion for reflecting light emitted from the active layer; and
   a current spreading layer provided on the light emitting portion opposite to the reflective portion and comprising a concavo-convex portion on a surface thereof,
   wherein the reflective portion comprises a plurality of pair layers each comprising a first semiconductor layer and a second semiconductor layer different from the first semiconductor layer, and the first semiconductor layer has a thickness $T_{A1}$ defined by formula (1), and the second semiconductor layer has a thickness $T_{B1}$ defined by formula (2), $$T_{A1}=\lambda_p/(4n_A\sqrt{(1-(n_{In}\sin\theta/n_A)^2)})\qquad\text{Formula (1)}$$

$$T_{B1}=\lambda_p/(4n_B\sqrt{(1-(n_{In}\sin\theta/n_B)^2)})\qquad\text{Formula (2)}$$

wherein $T_{A1}\geq\lambda_p/4n_A$, $T_{B1}\geq\lambda_p/4n_B$, is a peak wavelength of the light emitted from the active layer, $n_A$ is a refractive index of the first semiconductor layer, $n_B$ is a refractive index of the second semiconductor layer, $n_{In}$ is a refractive index of the first cladding layer, and θ is an incident angle which is defined as an angle with respect to a normal line of an incident plane from the first cladding layer to the first semiconductor layer, wherein the reflective portion comprises at least three pair layers, thicknesses of a plurality of the pair layers are different from each other due to a θ value in the formulas (1) and (2) being different in each of a plurality of the pair layers, and at least one of a plurality of the pair layers comprises the first and second semiconductor layers with a θ value of not less than 50°.

2. The light-emitting element according to claim 1, further comprising:
   an intermediate layer provided between the second cladding layer and the current spreading layer,
   wherein the intermediate layer comprises a semiconductor having a bandgap energy between bandgap energies of a semiconductor composing the second cladding layer and a semiconductor composing the current spreading layer.

3. The light-emitting element according to claim 2, wherein
   a plurality of the pair layers comprise a pair layer comprising the first semiconductor layer having a thickness $T_{A1}$ not less than 1.5 times $\lambda_{p1}/4\,n_A$, and the second semiconductor layer having a thickness $T_{B1}$ not less than 1.5 times $\lambda_{p1}/4\,n_B$.

4. The light-emitting element according to claim 3, wherein
   the reflective portion comprises a semiconductor material having a bandgap energy greater than that of a semiconductor composing the active layer, the semiconductor material being transparent to the light emitted from the active layer.

5. The light-emitting element according to claim 4, wherein
   the first semiconductor layer comprises $Al_XGa_{1-X}As$ ($0\leq X\leq 1$) or $Al_{0.5}In_{0.5}P$, and
   the second semiconductor layer is formed of $Al_YGa_{1-Y}As$ ($0\leq Y\leq 1$) and has a refractive index different from that of the first semiconductor layer.

6. The light-emitting element according to claim 5, wherein in a first pair layer, or first and second pair layers of the reflective portion counting from a side of the semiconductor substrate, the first semiconductor layer comprises AlAs or $Al_{0.5}In_{0.5}P$, and the second semiconductor layer comprises a semiconductor having a bandgap smaller than that of a semiconductor composing the active layer or GaAs which is not transparent to the light emitted from the active layer.

7. The light-emitting element according to claim 1, wherein the concavo-convex portion has arithmetic mean roughness Ra of not less than 0.04 μm and not more than 0.25 μm.

8. The light-emitting element according to claim 1, wherein
the concavo-convex portion has a root mean square roughness RMS of not less than 0.05 μm and not more than 0.35 μm.

9. The light-emitting element according to claim 1, wherein
the reflective portion comprises at least six pairs or more of the pair layers.

10. The light-emitting element according to claim 1, wherein
the semiconductor substrate comprises GaAs.

11. The light-emitting element according to claim 2, wherein
the intermediate layer comprises $Ga_zIn_{1-z}P$ ($0.6 \leq Z \leq 0.9$), and
the current spreading layer comprises GaP.

12. The light-emitting element according to claim 1, further comprising:
a front surface electrode provided at a predetermined position in a region of the current spreading layer except a region where the concavo-convex portion is provided; and
a light extracting layer formed at a portion except the front surface electrode, and comprising a material transparent to the light emitted from the active layer and having a refractive index smaller than that of the semiconductor composing the current spreading layer and larger than that of the air.

13. The light-emitting element according to claim 12, wherein
the light extracting layer has a thickness d in a range of ±30% of a value defined by $A+\lambda_p/(4 \times n)$, where $\lambda_p$ is a wavelength of the light emitted from the active layer, n is a refractive index of a material composing the light extracting layer, and A (which is an odd number) is a constant.

14. A method of making a light-emitting element, comprising:
forming on a semiconductor substrate a reflective portion comprising a plurality of pair layers each comprising a first semiconductor layer and a second semiconductor layer different from the first semiconductor layer, a light emitting portion comprising an active layer sandwiched between a first cladding layer of a first conductivity type and a second cladding layer of a second conductivity type different from the first conductivity type, and a current spreading layer formed on the light emitting portion;
forming a front surface electrode at a predetermined position of the current spreading layer; and
forming a concavo-convex portion in a portion except a region where the front surface electrode is formed,
wherein the first semiconductor layer has a thickness $T_{A1}$ defined by formula (1), and the second semiconductor layer has a thickness $T_{B1}$ defined by formula (2), $$T_{A1} = \lambda_p/(4n_A\sqrt{(1-(n_{In}\sin\theta/n_A)^2)}) \quad \text{Formula (1)}$$

$$T_{B1} = \lambda_p/(4n_B\sqrt{(1-(n_{In}\sin\theta/n_B)^2)}) \quad \text{Formula (2)}$$

wherein $T_{A1} \geq \lambda_p/4n_A$, $T_{B1} \geq \lambda_p/4n_B$, $\lambda_p$ is a peak wavelength of the light emitted from the active layer, $n_A$ is a refractive index of the first semiconductor layer, $n_B$ is a refractive index of the second semiconductor layer, $n_{In}$ is a refractive index of the first cladding layer, and θ is an incident angle which is defined as an angle with respect to a normal line of an incident plane from the first cladding layer to the first semiconductor layer, wherein the reflective portion comprises at least three pair layers, thicknesses of a plurality of the pair layers are different from each other due to a θ value in the formulas (1) and (2) being different in each of a plurality of the pair layers, and at least one of a plurality of the pair layers comprises the first and second semiconductor layers with a θ value of not less than 50°.

15. The method of making a light-emitting element according to claim 14, wherein
the forming of the concavo-convex portion is carried out after the forming of the front surface electrode.

* * * * *